United States Patent
Fratin et al.

(10) Patent No.: US 10,622,558 B2
(45) Date of Patent: Apr. 14, 2020

(54) NON-VOLATILE MEMORY CELL STRUCTURES INCLUDING A CHALCOGENIDE MATERIAL HAVING A NARROWED END AND A THREE-DIMENSIONAL MEMORY DEVICE

(71) Applicant: Intel Corporation, Santa Clara, CA (US)

(72) Inventors: Lorenzo Fratin, Buccinasco (IT); Russell L. Meyer, Boise, ID (US); Fabio Pellizzer, Cornate d'Adda (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/942,281

(22) Filed: Mar. 30, 2018

(65) Prior Publication Data
US 2019/0044063 A1 Feb. 7, 2019

(51) Int. Cl.
*G11C 11/00* (2006.01)
*H01L 45/00* (2006.01)
*H01L 27/24* (2006.01)

(52) U.S. Cl.
CPC ........ *H01L 45/1233* (2013.01); *H01L 27/249* (2013.01); *H01L 45/04* (2013.01); *H01L 45/1226* (2013.01); *H01L 45/1246* (2013.01); *H01L 45/1253* (2013.01); *H01L 45/143* (2013.01); *H01L 45/144* (2013.01); *H01L 45/146* (2013.01); *H01L 45/16* (2013.01); *H01L 45/1616* (2013.01)

(58) Field of Classification Search
CPC ........................ H01L 45/1233; H01L 45/1253
USPC ...... 365/148, 163, 46; 438/139, 382, 95, 130
See application file for complete search history.

(56) References Cited

U.S. PATENT DOCUMENTS

| | | |
|---|---|---|
| 5,712,814 A | 1/1998 | Fratin et al. |
| 5,915,185 A | 6/1999 | Fratin et al. |
| 5,920,776 A | 7/1999 | Fratin et al. |
| 5,977,591 A | 11/1999 | Fratin et al. |
| 6,369,406 B1 | 4/2002 | Ravazzi et al. |
| 6,507,067 B1 | 1/2003 | Fratin et al. |
| 8,154,006 B2 | 4/2012 | Mariani et al. |
| 8,546,231 B2 | 10/2013 | Pellizzer et al. |
| 8,729,523 B2 | 5/2014 | Pio |
| 8,841,649 B2 | 9/2014 | Pio |

(Continued)

FOREIGN PATENT DOCUMENTS

EP 0621604 A1 10/1994

OTHER PUBLICATIONS

Cappelletti et al.; "Failure Mechanisms of Flash Cell in Program/Erase Cycling;" In: Proceedings of 1994 IEEE International Electron Devices Meeting, IEDM 94; (Dec. 1994); pp. 291-294; <doi: 10.1109/IEDM.1994.383410 >.

(Continued)

*Primary Examiner* — Connie C Yoha
(74) *Attorney, Agent, or Firm* — Thorpe North & Western, LLP; David W. Osborne

(57) ABSTRACT

A memory cell can include a chalcogenide material having a narrowed end. A conductive material can be positioned at the narrowed end of the chalcogenide material. A dielectric barrier layer can be disposed between the conductive material and the narrowed end of the chalcogenide material. A dielectric spacer material can be positioned along a narrowed segment of the chalcogenide material.

18 Claims, 11 Drawing Sheets

(56) References Cited

U.S. PATENT DOCUMENTS

| | | |
|---|---|---|
| 8,975,148 B2 | 3/2015 | Pellizzer et al. |
| 9,793,207 B1 * | 10/2017 | Yang ................. H01L 23/53257 |
| 2013/0126822 A1 | 5/2013 | Pellizzer et al. |
| 2013/0235654 A1 * | 9/2013 | Rigano .................. H01L 45/06 |
| | | 365/163 |
| 2013/0341587 A1 | 12/2013 | Pellizzer et al. |
| 2014/0198565 A1 * | 7/2014 | Pellizzer ................ H01L 45/06 |
| | | 365/163 |
| 2014/0217349 A1 | 8/2014 | Hopkins |
| 2015/0144864 A1 | 5/2015 | Pellizzer et al. |
| 2016/0133671 A1 * | 5/2016 | Fantini ................ H01L 27/2463 |
| | | 257/4 |
| 2018/0040370 A1 | 2/2018 | Tortorelli et al. |
| 2019/0044060 A1 | 2/2019 | Russell et al. |
| 2019/0044063 A1 | 2/2019 | Fratin et al. |
| 2019/0067571 A1 | 2/2019 | Fratin et al. |
| 2019/0088714 A1 | 3/2019 | Pellizzer et al. |
| 2019/0115532 A1 | 4/2019 | Varesi et al. |

OTHER PUBLICATIONS

Micheloni et al.; "A 0.13-μm CMOS NOR Flash Memory Experimental Chip for 4-b/cell Digital Storage;" In: Proceedings of the 28$^{th}$ European Solid-State Circuits Conference, ESSCIRC 2002; (Sep. 2002); pp. 131-134; IEEE.

Pavan et al.; "Electrical Characterization and Reliability of Double-Doped Drain MOS Transistors Compatible with an EEPROM Process;" Microelectronics Journal; (1993); pp. 827-839; vol. 24.

* cited by examiner

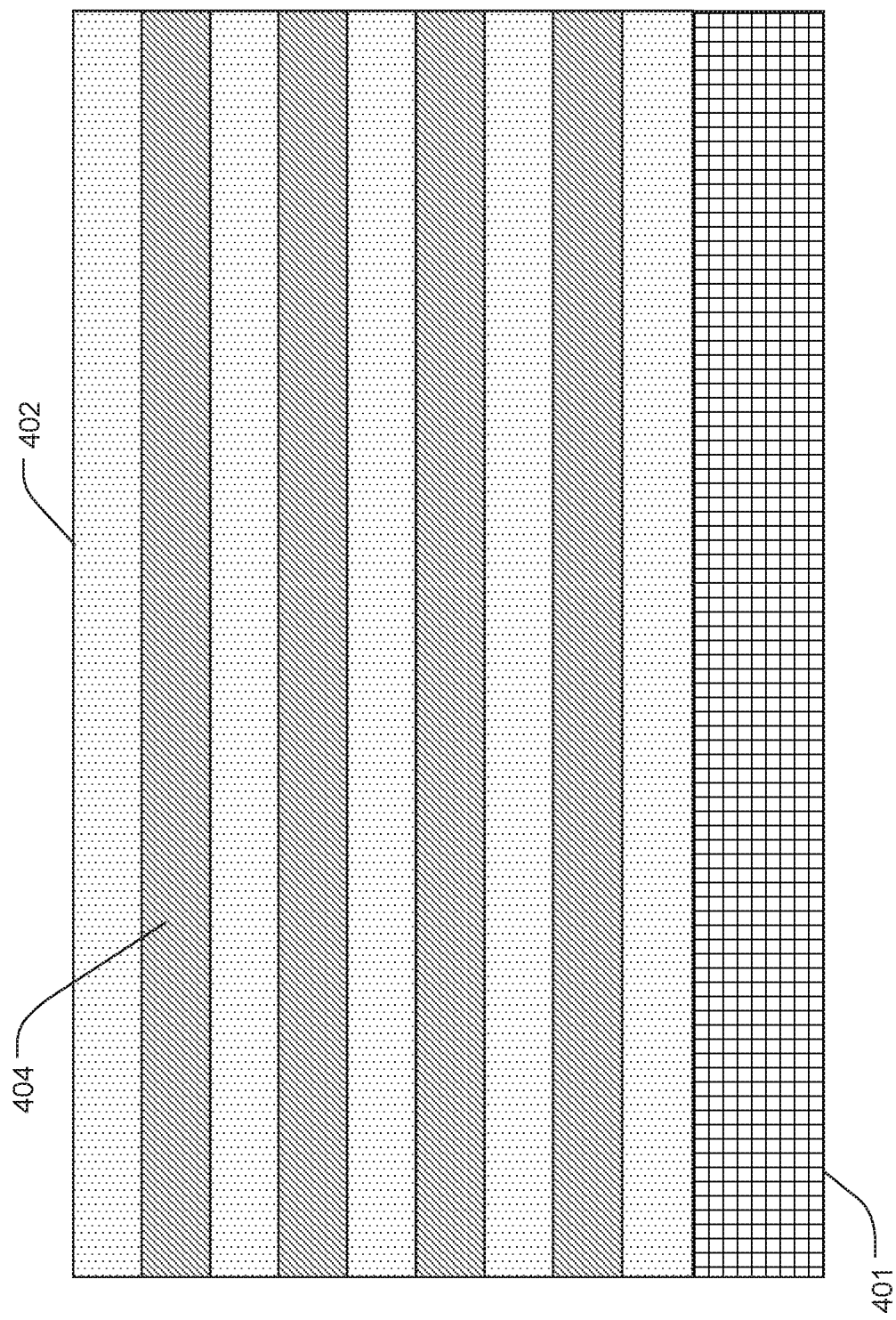

NON-VOLATILE MEMORY CELL STRUCTURES INCLUDING A CHALCOGENIDE MATERIAL HAVING A NARROWED END AND A THREE-DIMENSIONAL MEMORY DEVICE

BACKGROUND

Chalcogenide materials have properties that invite their use in a number of applications such as ovonic threshold switches and phase change memory (PCM). For example, different physical states of the chalcogenide material can have different levels of electrical resistance. As one specific example, one state of a chalcogenide material, such as an amorphous state, can have a high electrical resistance, while another state, such as a crystalline state, can have a low electrical resistance. Different levels of electrical resistance can be used to store binary information. Once the binary information is stored, the information can be read by detecting the electrical resistance of the material. The fact that each state persists once fixed makes chalcogenide materials valuable in non-volatile memory (NVM) structures and devices.

BRIEF DESCRIPTION OF THE DRAWINGS

FIGS. 4A-4K are cross-sectional views of steps in a method of manufacturing a memory device, in accordance with examples of the present disclosure.

DESCRIPTION OF EMBODIMENTS

Figure 1:
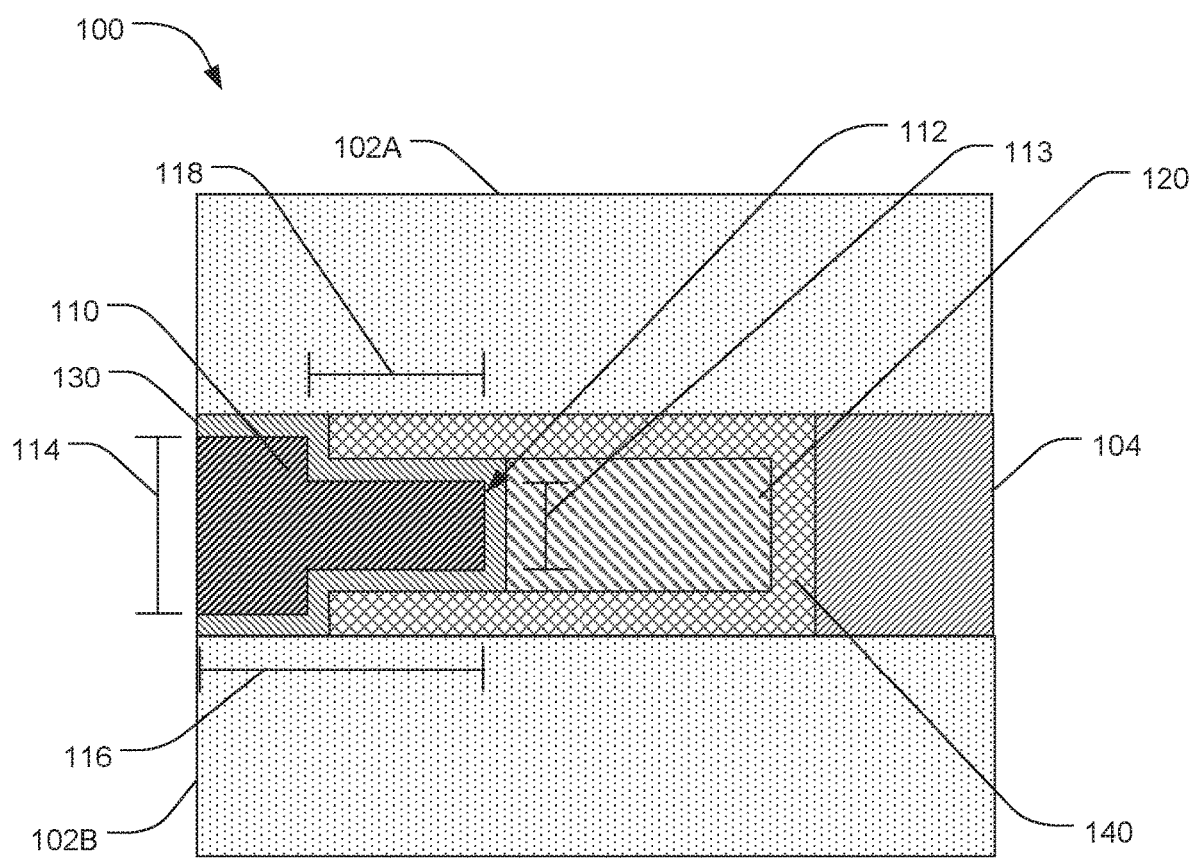
FIG. 1 illustrates a cross-sectional view of a memory cell, in accordance with an example embodiment.

Although the following detailed description contains many specifics for the purpose of illustration, a person of ordinary skill in the art will appreciate that many variations and alterations to the following details can be made and are considered to be included herein. Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes a plurality of such layers.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term, like "comprising" or "including," in this written description it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" structures or elements are in physical contact with one another and are attached. Objects described herein as being "adjacent to" each other may be in physical contact with each other, in close proximity to each other, or in the same general region or area as each other, as appropriate for the context in which the phrase is used.

Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of"

an ingredient or element may still actually contain such item as long as there is no measurable effect thereof.

As used herein, the term "about" is used to provide flexibility to a numerical range endpoint by providing that a given value may be "a little above" or "a little below" the endpoint. Unless otherwise stated, use of the term "about" in accordance with a specific number or numerical range should also be understood to provide support for such numerical terms or range without the term "about". For example, for the sake of convenience and brevity, a numerical range of "about 50 angstroms to about 80 angstroms" should also be understood to provide support for the range of "50 angstroms to 80 angstroms." Furthermore, it is to be understood that in this specification support for actual numerical values is provided even when the term "about" is used therewith. For example, the recitation of "about" 30 should be construed as not only providing support for values a little above and a little below 30, but also for the actual numerical value of 30 as well.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below and specific embodiments are then described in further detail. This initial summary is intended to aid readers in understanding the technological concepts more quickly, but is not intended to identify key or essential features thereof, nor is it intended to limit the scope of the claimed subject matter.

In traditional phase change memory (PCM) cells, different physical states of the PCM material can have different levels of electrical resistance. For example, one state, such as an amorphous state, can have a high electrical resistance, while another state, such as a crystalline state, can have a low electrical resistance. The different levels of electrical resistance between the amorphous and crystalline states can be used to store binary information.

In some additional examples, chalcogenide-based memory cells can operate on a somewhat different principle of operation. For example, applying a specific programming pulse (e.g. a positive or negative pulse at a particular voltage) to the chalcogenide material can cause ions to crowd near a particular electrode of the cell. As distribution of the ions in the chalcogenide material changes, the threshold voltage of the chalcogenide material can also change. For example, in some cases, a particular programming pulse can cause ions to crowd near a first electrode to produce a high voltage threshold state. An opposite polarity programming pulse can be used to cause ions to crowd near a second electrode positioned on an opposite side of the chalcogenide material to produce a low voltage threshold state. The difference in voltage threshold between these two states (i.e. set state and reset state, or vice versa) can be used to store different programmed states and can be defined as the programming window of the chalcogenide-based memory cell.

The programming window can be further widened by modifying the shape of the chalcogenide material. More specifically, modifying the chalcogenide material to have a variable cross-section, such as a narrowed cross-section along a portion of the chalcogenide material, can further widen the programming window of a chalcogenide-based memory cell. For example, a narrowed profile can result in a greater density of ions at or near one electrode, which can produce a region with a high density of ion migration and a region with a low density of ion migration within the cell. Depending on the polarity of the memory cell, this concentration of migrating ions can represent a logic "1" or logic "0" state. The wider programming window due to the narrowed profile can facilitate reliable reading of individual chalcogenide-based memory cells with reduced read errors.

In one embodiment, the present disclosure describes chalcogenide-based memory cells having a narrowed profile to facilitate reliable reading of individual memory cells. The memory cells can include a chalcogenide material having a narrowed end. A conductive material can be positioned at the narrowed end of the chalcogenide material. A dielectric barrier layer can be positioned between the conductive material and the narrowed end of the chalcogenide material. A dielectric spacer material can be positioned along a narrowed segment of the chalcogenide material.

One example of a memory cell is illustrated in FIG. 1. Memory cell 100 can include a chalcogenide material 110 having a narrowed end 112. A conductive material 120 can be positioned at the narrowed end 112 of the chalcogenide material 110. A dielectric spacer material 140 can be positioned to shape the chalcogenide material 110 (e.g. can surround part of the chalcogenide material) to shape or form the narrowed end 112. A dielectric barrier layer 130 can isolate the chalcogenide material 110 from the dielectric spacer material 140 and the conductive material 120. The dielectric barrier layer 130 can also partially shape or form the narrowed end 112 of the chalcogenide material 110. In some examples, the memory cell 100 can be formed between two dielectric layers 102A, 102B. Further, in some examples, the memory cell 100 can be formed within a recessed placeholder layer 104.

A variety of chalcogenide materials can be used in the memory cells described herein. In some examples, the chalcogenide material can include germanium, antimony, tellurium, silicon, nickel, gallium, arsenic, silver, tin, gold, lead, bismuth, indium, selenium, oxygen, sulphur, nitrogen, carbon, yttrium and scandium the like, or a combination thereof. In some specific examples, the chalcogenide material can include selenium, arsenic, tellurium, silicon, and germanium. In some further examples, the chalcogenide material can be a chalcogenide glass or amorphous chalcogenide material.

As described above, the chalcogenide material can be shaped with a narrowed end to produce an effective programming window to facilitate reliable reading of individual chalcogenide-based memory cells. With reference to FIG. 1, in some examples, the narrowed end 112 of the chalcogenide material 110 can have a narrowed thickness 113 that is from about 50% to about 90% of a thickness 114 at an opposite end of the chalcogenide material 110. In still other examples, the narrowed end of the chalcogenide material can have a narrowed thickness that is from about 60% to about 80% of a thickness at an opposite end thereof.

The narrowed segment of the chalcogenide material can extend along a variety of lengths of the chalcogenide material. With reference to FIG. 1, in some examples, the narrowed segment of the chalcogenide material 110 can have a length 118 that is from about 10% to about 90% of an entire length 116 of the chalcogenide material 110. In still other examples, the narrowed segment of the chalcogenide material can have a length that is from about 40% to about 60% of an entire length of the chalcogenide material. It is noted that FIG. 1 illustrates the narrowed segment of the chalcogenide material being formed somewhat abruptly and having a substantially uniform thickness. However, this is not necessarily required. In some examples, the narrowed segment can be formed in a more continuous fashion, such as a continuous taper along a narrowed segment of the chalcogenide material, or along an entire length of the chalcogenide material, for example. Thus, the specific geometry of the chalcogenide material can be adjusted to form the narrowed segment and culminating narrowed end thereof to achieve a desired programming window.

In some specific examples, the chalcogenide material can have a programming window between a reset state and a set state of at least 500 millivolts (mV). In other examples, the chalcogenide material can have a programming window between a reset state and a set state of at least 1000 mV. In some examples, the programming window between a reset state and a set state can be from about 500 mV to about 1000 mV.

The dielectric barrier layer formed between the chalcogenide material and the conductive material can include a variety of materials. Generally, the dielectric barrier can include any suitable material that can prevent or minimize cross-contamination between the chalcogenide material and the conductive material without substantially interfering with the current flow therebetween. Thus, the dielectric barrier can facilitate charge tunneling while minimizing diffusion of atoms between the chalcogenide material and the conductive material. In some specific examples, the dielectric barrier layer can include alumina, hafnium oxide, zirconium oxide, silicon nitride, silicon oxide, the like, or a combination thereof. The dielectric barrier layer can generally have a thickness of from about 0.5 nanometers (nm) to about 2 nm. In other examples, the dielectric barrier layer can have a thickness of from about 0.3 nm to about 3 nm.

The conductive material can include a variety of suitable materials. Generally, the conductive material can include any material having an electrical resistivity of less than 100 µOhm-cm that is capable of conformal deposition within a cell recess, as will be described in greater detail below. In some examples, the conductive material can include carbon (C), tungsten (W), tungsten carbide (WC), graphene, diamond-like carbon (DLC); aluminum (Al), aluminum copper alloy (AlCu), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), ruthenium (Ru), ruthenium nitride (RuN), the like, or a combination thereof. In some specific examples, the conductive material can include W.

The dielectric spacer material can also be formed of a variety of materials. Generally, the dielectric spacer material can be formed of any material suitable for highly conformal deposition in a cell recess and that is able to sustain a voltage drop applied at the edges of the chalcogenide material. In some examples, the dielectric spacer material can include alumina, hafnium oxide, zirconium oxide, silicon nitride, silicon oxide, the like, or a combination thereof. The dielectric spacer material can generally have a thickness of from about 1 nm to about 20 nm. In other examples, the dielectric spacer material can have a thickness of from about 5 nm to about 50 nm. Further, the dielectric spacer material can generally extend along the chalcogenide material from the narrowed end to a distance of from about 10% to about 90% of an entire length of the chalcogenide material. In other examples, the dielectric spacer material can generally extend along the chalcogenide material from the narrowed end to a distance of from about 40% to about 60% of an entire length of the chalcogenide material.

Memory cells as described herein can also form part of a memory structure including a plurality of memory cells. For example, a plurality of memory cells as described herein can be oriented along a conductive column or conductive row (e.g. word lines and/or bit lines) at an end of the chalcogenide material opposite the narrowed end. Thus, the memory structure can include an array of memory cells oriented substantially perpendicularly to the conductive column or conductive row. The end of the chalcogenide material opposite the narrowed end of individual memory cells can be positioned along a length of the conductive column or conductive row.

The memory cells disclosed herein can also form part of a three-dimensional memory device. In one embodiment, the memory device can include an array of conductive columns, an array of conductive rows, and an array of memory cells interconnecting the array of conductive columns and the array of conductive rows. Memory cells of the array can be individually addressable. Individual memory cells can include a chalcogenide material having a narrowed end. A conductive row can be positioned at the narrowed end of the chalcogenide material and a conductive column can be positioned at an opposite end thereof. Individual memory cells can also include a dielectric barrier layer positioned between the narrowed end of the chalcogenide material and the conductive row. A dielectric spacer material can be positioned along a narrowed segment of the chalcogenide material.

Figure 2:
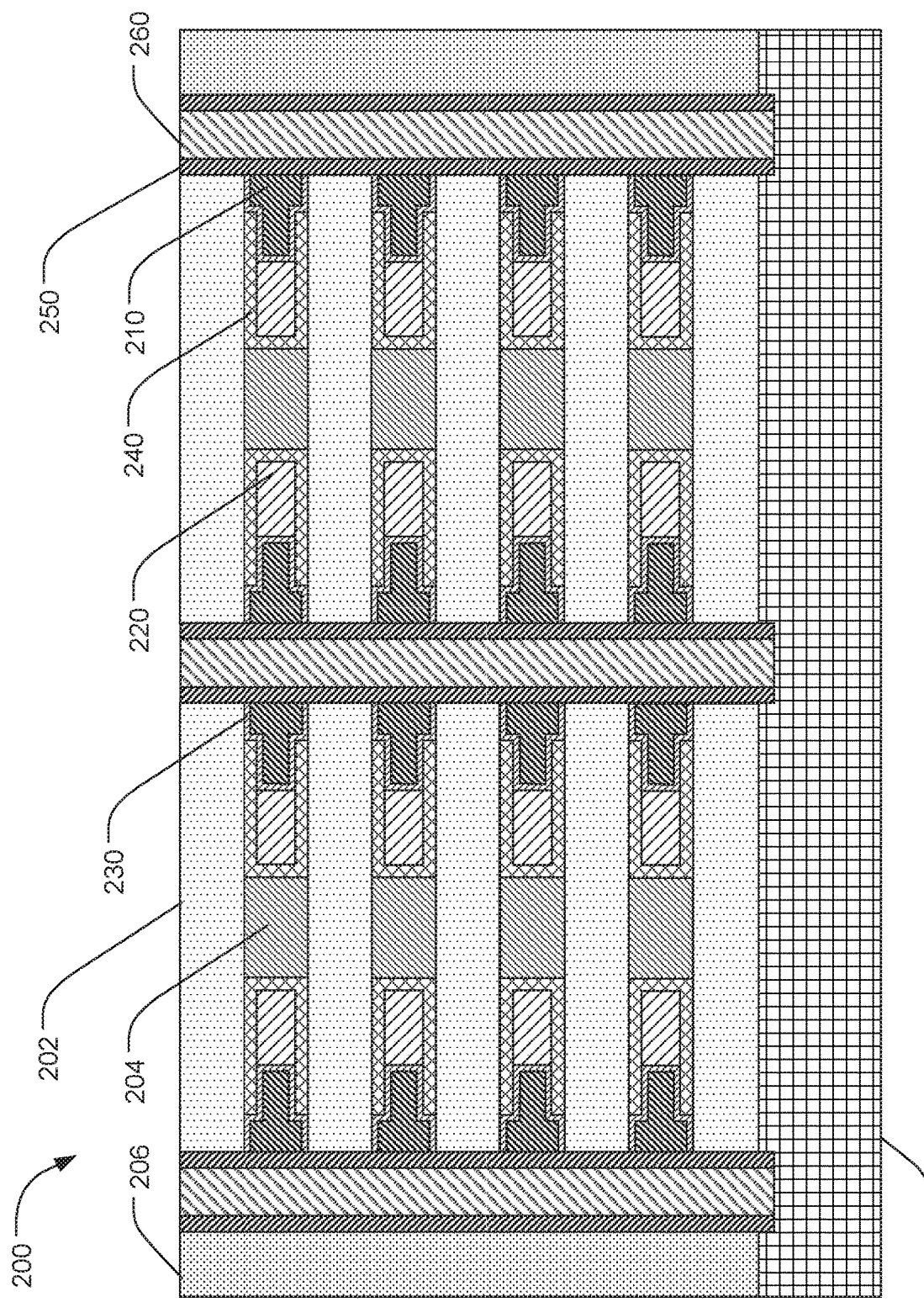
FIG. 2 illustrates a cross-sectional view of a memory device, in accordance with and example embodiment.

Such architecture is further illustrated in FIG. 2. Memory device 200 can include an array of columns 260, an array of rows 220, and an array of memory cells. Individual memory cells can include a chalcogenide material 210, a dielectric barrier layer 230, and a dielectric spacer material 240. The various materials and parameters of the individual memory cell components are described elsewhere herein. Individual memory cells can be arranged in a three-dimensional pattern interconnecting individual conductive columns 260 and individual conductive rows 220.

In some examples, the array of conductive rows can be formed of a first conductive material. Generally, the first conductive material can include any material having an electrical resistivity of less than 100 µOhm-cm that is capable of conformal deposition within a cell recess. In some examples, the first conductive material can include tungsten (W), aluminum (Al), aluminum copper alloy (AlCu), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), the like, or a combination thereof. In some specific examples, the first conductive material can include W.

In some examples, the array of conductive columns can be formed of a second conductive material. Generally, the second conductive material can include any material having an electrical resistivity of less than 100 µOhm-cm that is capable of forming a conductive column within a cell trench. In some examples, the second conductive material can include tungsten (W), aluminum (Al), aluminum copper alloy (AlCu), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), the like, or a combination thereof. In some specific examples, the second conductive material can include W.

In some examples, the array of conductive columns and the array of conductive rows can be formed of the same material (i.e. the first conductive material and the second conductive material can be the same). In other examples, the array of conductive columns and the array of conductive rows can be formed of different conductive materials (i.e. the first conductive material and the second conductive material can be different). In some additional examples, the array of conductive columns and the array of conductive rows can be oriented in a substantially perpendicular orientation, as illustrated in FIG. 2 with individual rows extending into and out of the page.

Returning again to FIG. 2, in some examples, the memory device 200 can include an electrode layer 250 formed along individual conductive columns 260 and being positioned between individual conductive columns 260 and the chalcogenide material 210 of individual memory cells. The electrode layer can generally include any suitable material that is a good electrical conductor and that can minimize or prevent cross-contamination between the chalcogenide material and the conductive column. Typically, the electrode layer can have an electrical resistivity of from about 100 µOhm-cm to about 10 mOhm-cm. In some examples, the electrode layer can include one or more conductive or semiconductive materials. Non-limiting examples can include carbon (C), carbon nitride ($C_xN_y$), n-doped polysilicon, p-doped polysilicon, metals (e.g. Al, Cu, Ni, Cr, Co, Ru, Rh, Pd, Ag, Pt, Au, Ir, Ta, and W, for example), conductive metal nitrides, (e.g. TiN, TaN, WN, and TaCN, for example) conductive metal silicides (e.g. tantalum silicides, tungsten silicides, nickel silicides, cobalt silicides, and titanium silicides, for example), conductive metal silicides nitrides (e.g. TiSiN and WSiN, for example), conductive metal carbide nitrides (e.g. TiCN and WCN, for example), conductive metal oxides (e.g. $RuO_2$, for example), the like, or a combination thereof. The electrode layer can typically have a thickness of from about 5 nm to about 50 nm.

The individual memory cells can be formed between dielectric layers 202 to electrically isolate individual memory cells. A variety of suitable dielectric materials can be used form these insulating dielectric layers. Non-limiting examples can include silicon oxide, silicon nitride, silicon oxynitride, silicon carbide, undoped silicon, the like, or a combination thereof.

Further, in this particular example, individual memory cells are formed within recessed placeholder layers 204 where remaining placeholder material electrically isolates individual conductive rows from one another. A variety of suitable dielectric materials can used to form these placeholder layers. In particular, the placeholder layer can be formed of a dielectric material that can be recessed without substantially recessing the adjacent dielectric insulating layers. Non-limiting examples can include silicon oxide, silicon nitride, silicon carbide, undoped silicon, the like, or a combination thereof.

The array of columns 260, array of rows 220, array of memory cells, and other device layers can be formed on a substrate 201. Any suitable substrate material can be used. For example, the substrate can be a conventional silicon substrate or other bulk substrate including a layer of semiconductive material. The bulk substrate can include, but is not limited to, silicon, silicon-on-insulator (SOI), silicon-on-sapphire (SOS), epitaxial silicon, or the like, or a combination thereof on a base semiconductor foundation, or another semiconductor or optoelectrical material, such as silicon-germanium, germanium, gallium arsenide, indium phosphide, the like, or a combination thereof. The substrate may be doped or undoped.

A dielectric filler material 206 can be included to electrically isolate desired portions of the memory device. The dielectric filler material can include a variety of dielectric materials. Non-limiting examples can include silicon oxide, silicon nitride, silicon oxynitride, a spin-on-glass (SOG), a phosphosilicate glass (PSG), tetraethyl orthosilicate (TEOS), or borophosilicate glass (BPSG), the like, or a combination thereof.

Figure 3:
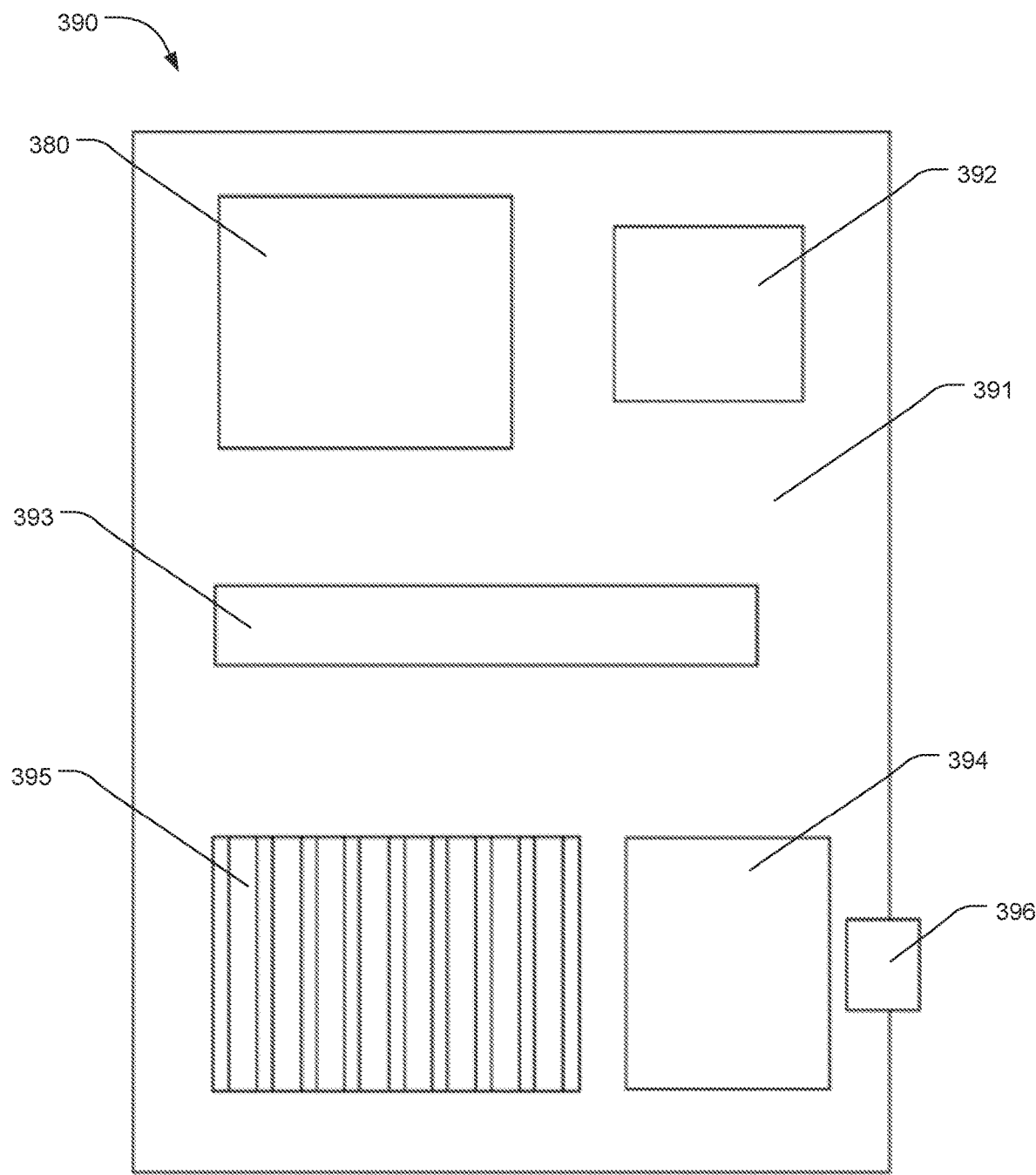
FIG. 3 illustrates a plan view of a computing system, in accordance with and example embodiment.

In some examples, a memory device as described herein can be included in a computing system. In one aspect, as illustrated in FIG. 3, a computing system 390 can include a motherboard 391 and a memory device 380 as described herein that is operably coupled to the motherboard 391. In some additional examples, a computing system 390 can include a processor 392, an additional memory device 393, a radio 394, a heat sink 395, a port 396, a slot 397, or any other suitable device or component, which can be operably coupled to the motherboard 391. The computing system 390 can comprise any type of computing system, such as a desktop computer, a laptop computer, a tablet computer, a smartphone, a wearable device, a server, etc. Other embodiments need not include all of the features specified in FIG. 3, and may include alternative features not specified in FIG. 3.

Circuitry used in electronic components or devices (e.g. a die) of a memory device can include hardware, firmware, program code, executable code, computer instructions, and/or software. Electronic components and devices can include a non-transitory computer readable storage medium which can be a computer readable storage medium that does not include signal. In the case of program code execution on programmable computers, the computing systems recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

The present disclosure also describes methods of manufacturing a memory cell and a memory device. For example, methods of manufacturing a chalcogenide-based memory cell can include forming a cell recess within a placeholder layer of a layered stack and depositing or forming a dielectric spacer material in the cell recess to form a narrowed portion thereof. The methods of manufacturing a memory cell can also include depositing or forming a conductive material in the cell recess, depositing or forming a dielectric barrier layer in the cell recess on the conductive material, and depositing or forming a chalcogenide material in the cell recess on the dielectric barrier layer. The narrowed portion of the cell recess can shape the chalcogenide material to have a narrowed end proximate to the conductive material.

Methods of manufacturing a chalcogenide-based memory device can include forming a layered stack comprising a plurality of alternating placeholder layers and dielectric layers. The methods of manufacturing a memory device can also include forming a plurality of trenches in the layered stack and recessing the plurality of placeholder layers along individual trenches to form a plurality of cell recesses. Additionally, the methods of manufacturing a memory device can include depositing or forming a dielectric spacer material in the plurality of cell recess to form a narrowed portion of individual cell recesses, depositing or forming a first conductive material in the plurality of cell recess to form an array of conductive rows, depositing or forming a dielectric barrier layer within the plurality of cell recess on the first conductive material, and depositing or forming a chalcogenide material within the plurality of cell recess on the dielectric barrier layer. The narrowed portion of individual cell recess can shape the chalcogenide material to have a narrowed end proximate to the first conductive material. The methods of manufacturing a memory device can also include depositing a second conductive material within the plurality of trenches to form an array of conductive columns. Individual conductive rows can be positioned at individual narrowed ends of the chalcogenide material and individual conductive columns can be positioned at opposite ends of the chalcogenide material.

Figure 4B:
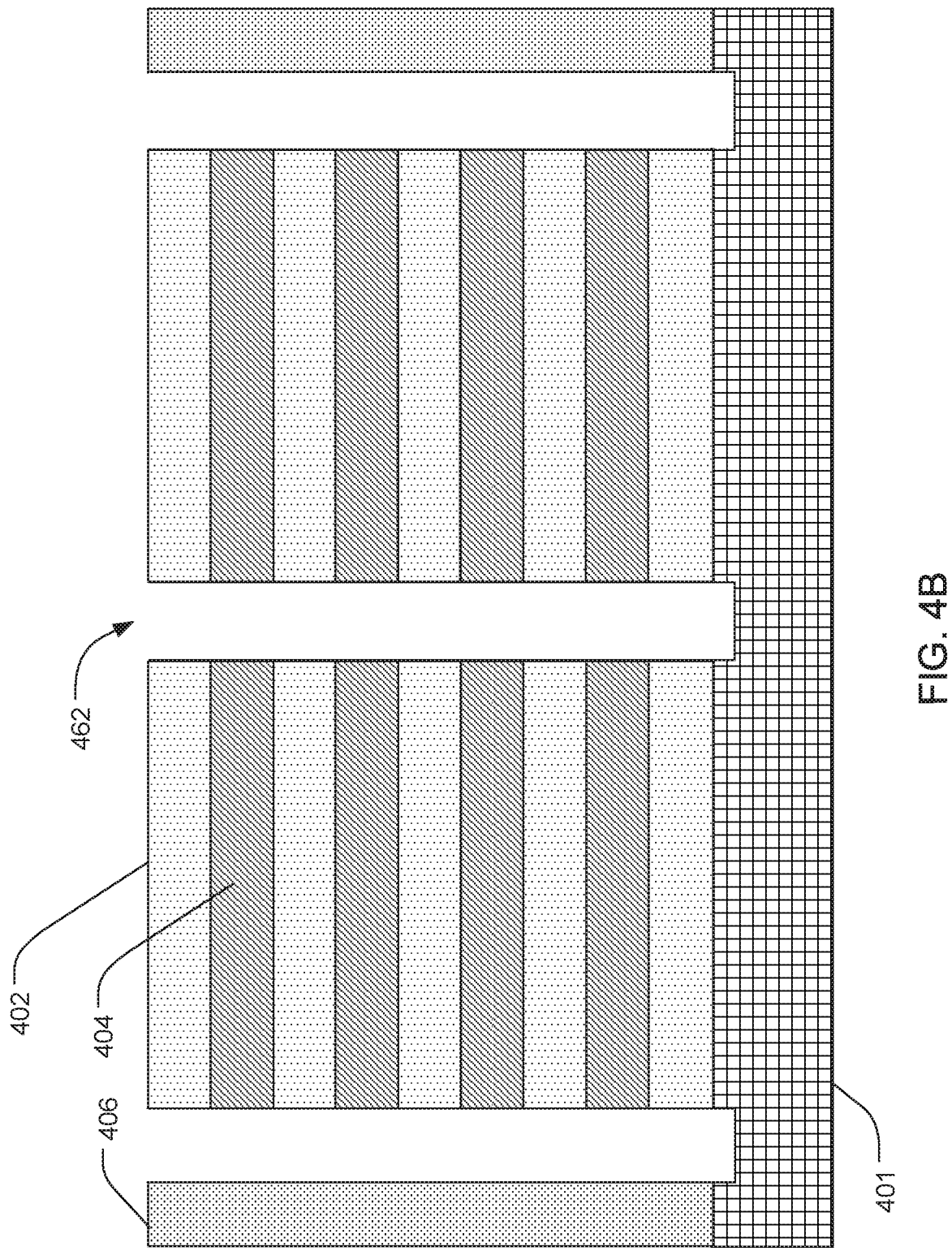

Methods of manufacturing a memory cell and methods of manufacturing a memory device can both be described in further detail with reference to FIGS. 4A-4K, each of which depict cross-sectional views of a memory device, and corresponding individual memory cells, at various stages of one example method of manufacturing. FIG. 4A illustrates a layered stack having a plurality of alternating dielectric layers 402 and placeholder layers 404 formed on a substrate 401. The various layers of the layered stack can be formed using any suitable manufacturing technique. Non-limiting examples can include chemical vapor deposition (CVD), physical vapor deposition (PVD), atomic layer deposition (ALD), the like, or a combination thereof.

As illustrated in FIG. 4B, a plurality of trenches 462 can be etched in the layered stack. The trenches can be formed using any suitable manufacturing technique, such as dry etching, for example. Also, illustrated in FIG. 4B, a dielectric filler material 406 can optionally be deposited or formed to isolate specific portions of the memory device.

Figure 4C:
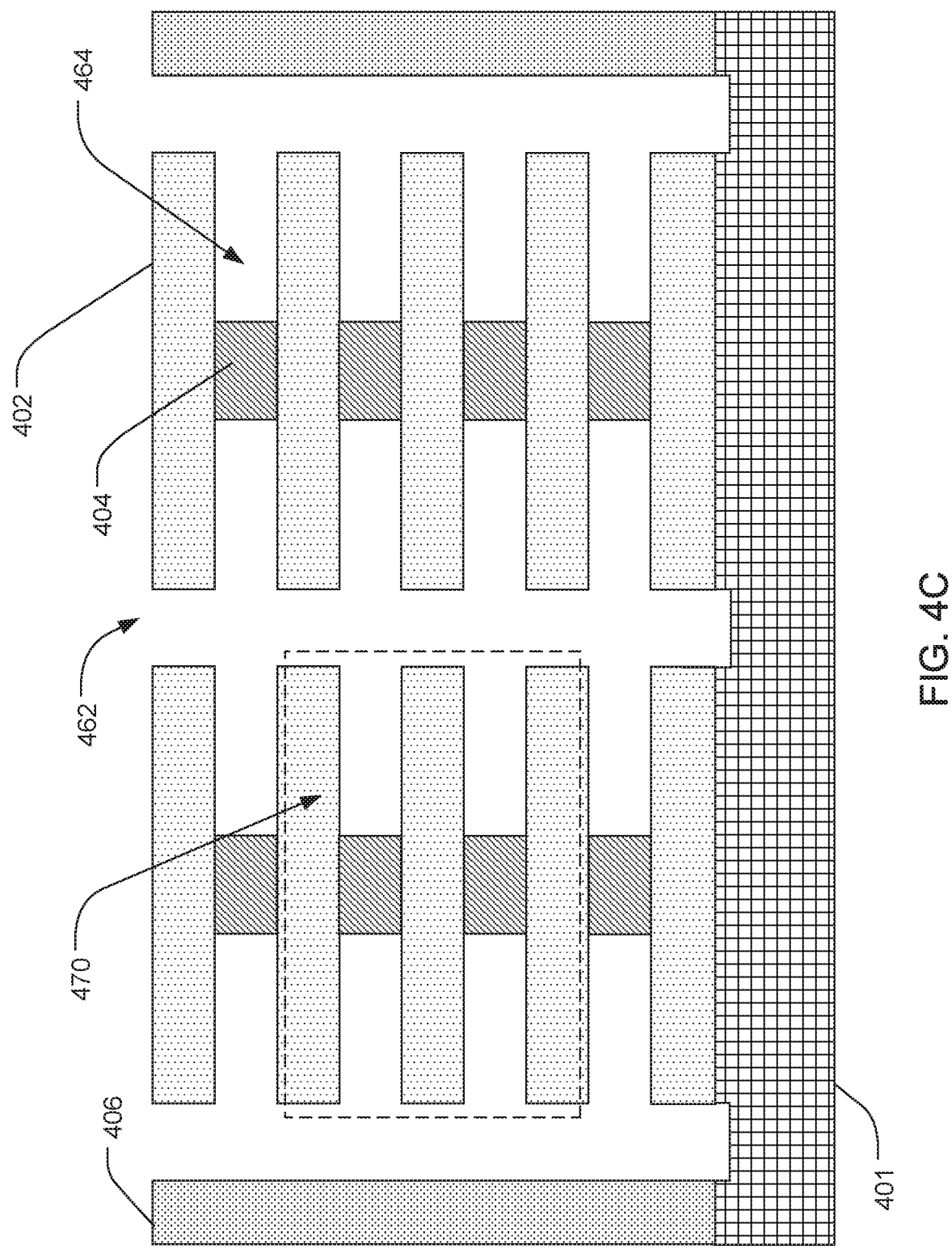

As illustrated in FIG. 4C, cell recesses 464 can be formed in the plurality of placeholder layers 404 along individual trenches 462. Cell recess 464 can be formed using any suitable manufacturing technique. Non-limiting examples can include wet etching, isotropic reactive ion etching, the like, or a combination thereof.

Figure 4D:
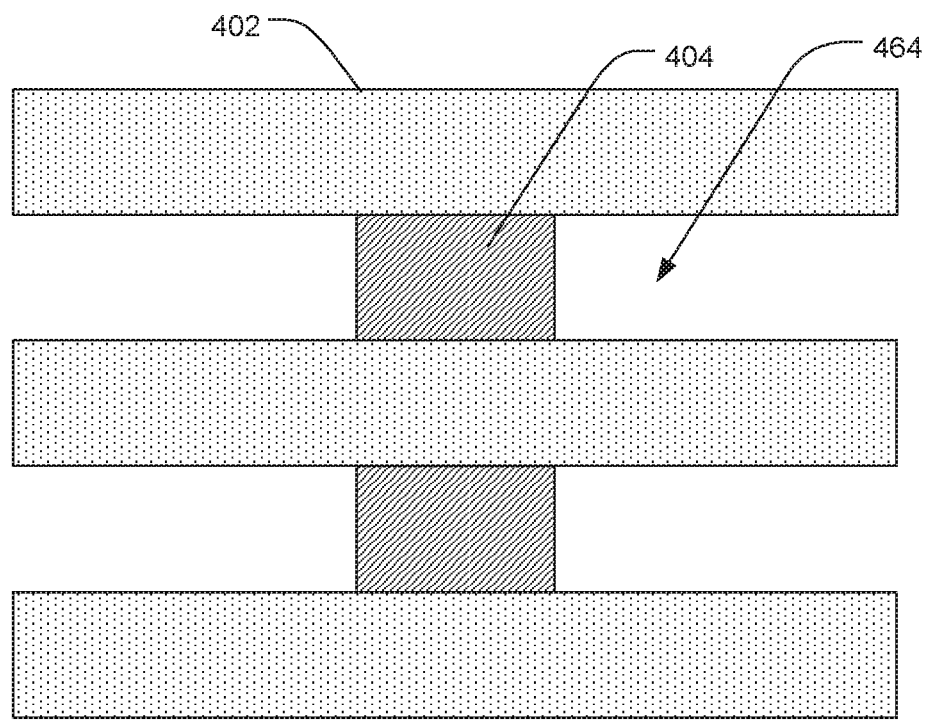
Figure 4E:
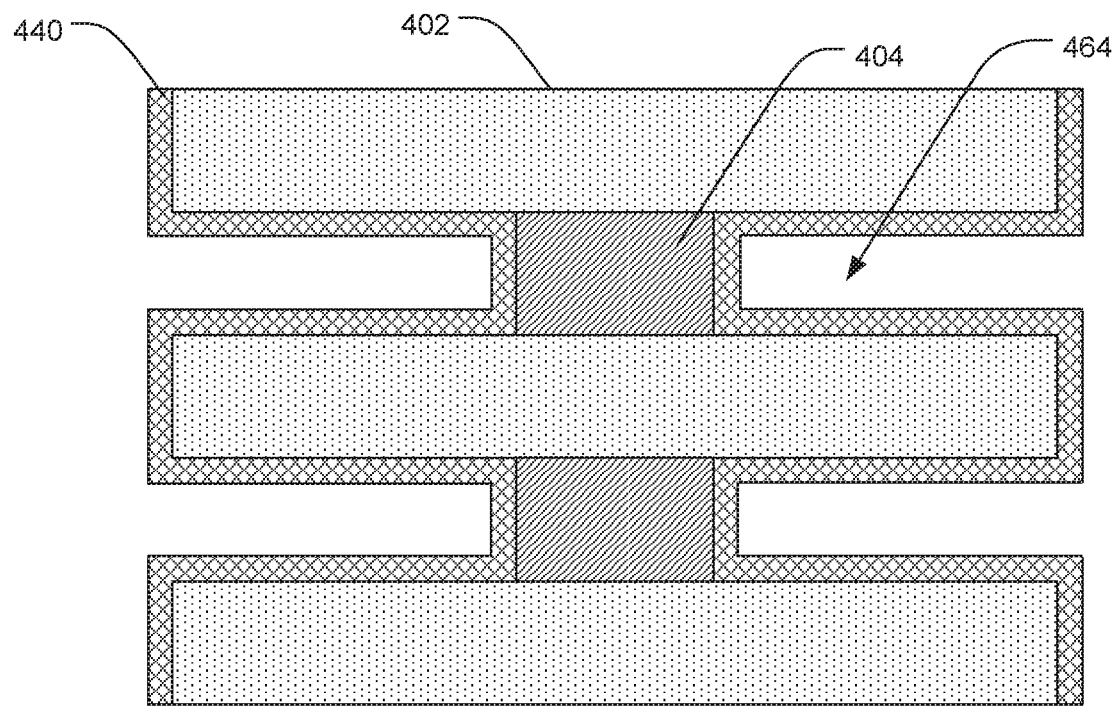

FIGS. 4D-4I depict a zoomed-in view of region 470 identified in FIG. 4C to more clearly illustrate memory cell formation. Specifically, FIG. 4D illustrates a zoomed-in view of region 470, depicting individual cell recesses 464. FIG. 4E illustrates a dielectric spacer material 440 conformally deposited or formed within individual cell recesses 464. The dielectric spacer material 440 can be deposited or formed using any suitable manufacturing technique. Non-limiting examples can include CVD, ALD, or the like.

Figure 4F:
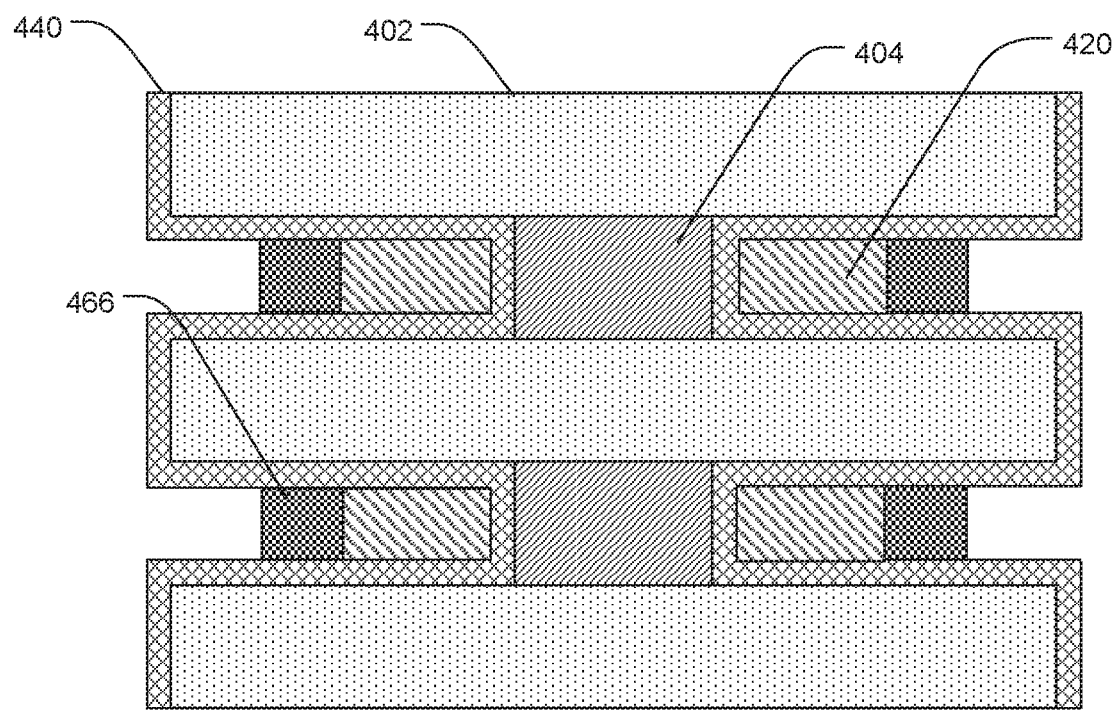

FIG. 4F illustrates a conductive material 420 (or first conductive material of individual conductive rows) deposited or formed in individual cell recesses 464 on the dielectric barrier material 440. The conductive material 420 can be deposited or formed using any suitable manufacturing technique. Non-limiting examples can include CVD, ALD, or the like.

In addition, FIG. 4F illustrates a sacrificial etch-stop material 466 deposited within individual cell recess 464 on the conductive material 420. The sacrificial etch-stop material 466 can include a dielectric material that is different from surrounding dielectric materials for specificity. In one specific example, the sacrificial etch-stop material can include polysilicon. The sacrificial etch-stop material can be deposited or formed using any suitable manufacturing technique. Non-limiting examples can include CVD, ALD, or the like.

Figure 4G:
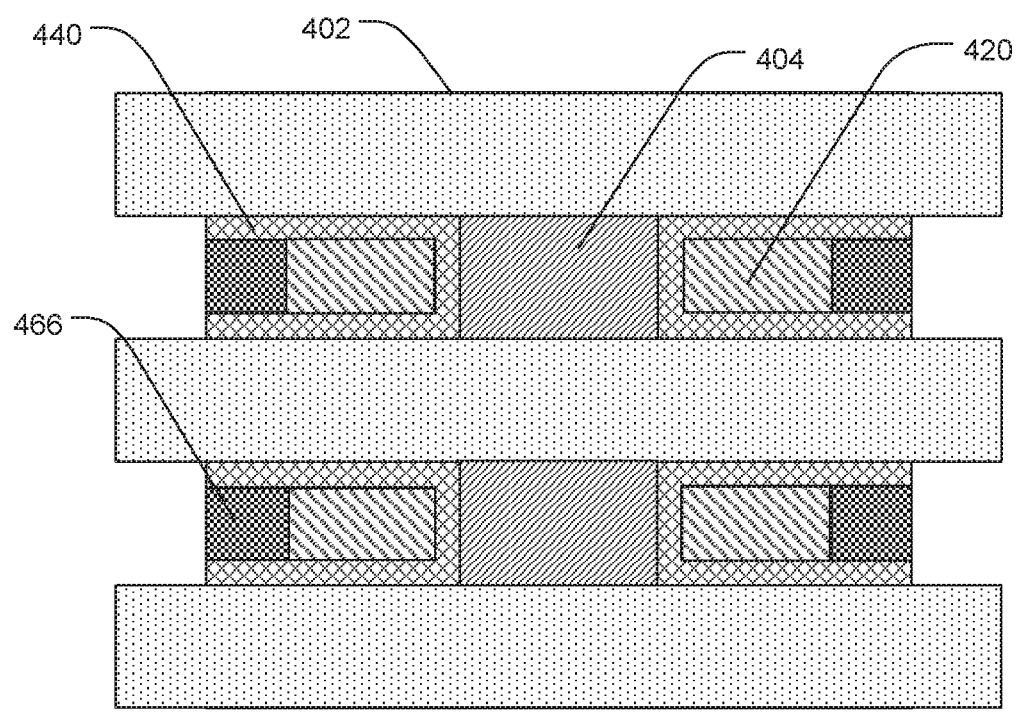

FIG. 4G, illustrates the removal of the dielectric barrier layer 440 (e.g. etched or otherwise recessed) back to the sacrificial etch-stop material 466. The dielectric barrier layer can be removed or recessed using any suitable technique. Non-limiting examples include wet etching, isotropic reactive ion etching, the like, or a combination thereof.

Figure 4H:
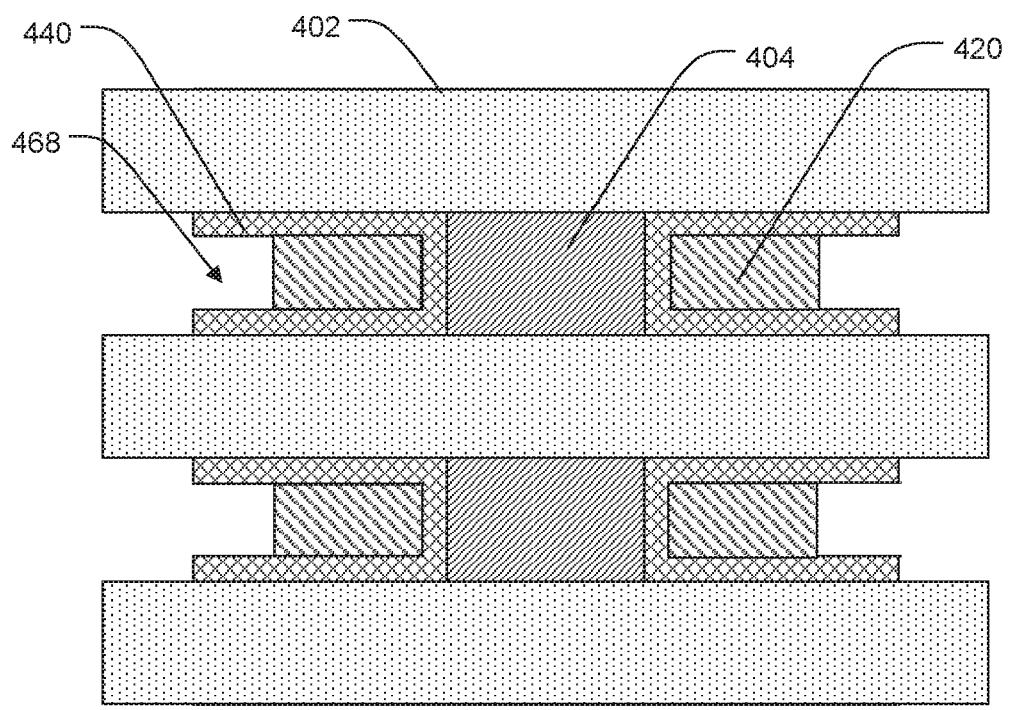

FIG. 4H illustrates individual cell recesses 464 after the sacrificial etch-stop material has been removed. The remaining dielectric spacer material 440 can form a narrowed portion or region 468 of individual cell recesses 464. The sacrificial etch-stop material can be removed using any suitable technique. Non-limiting examples include wet etching, isotropic reactive ion etching, the like, or a combination thereof.

Figure 4I:
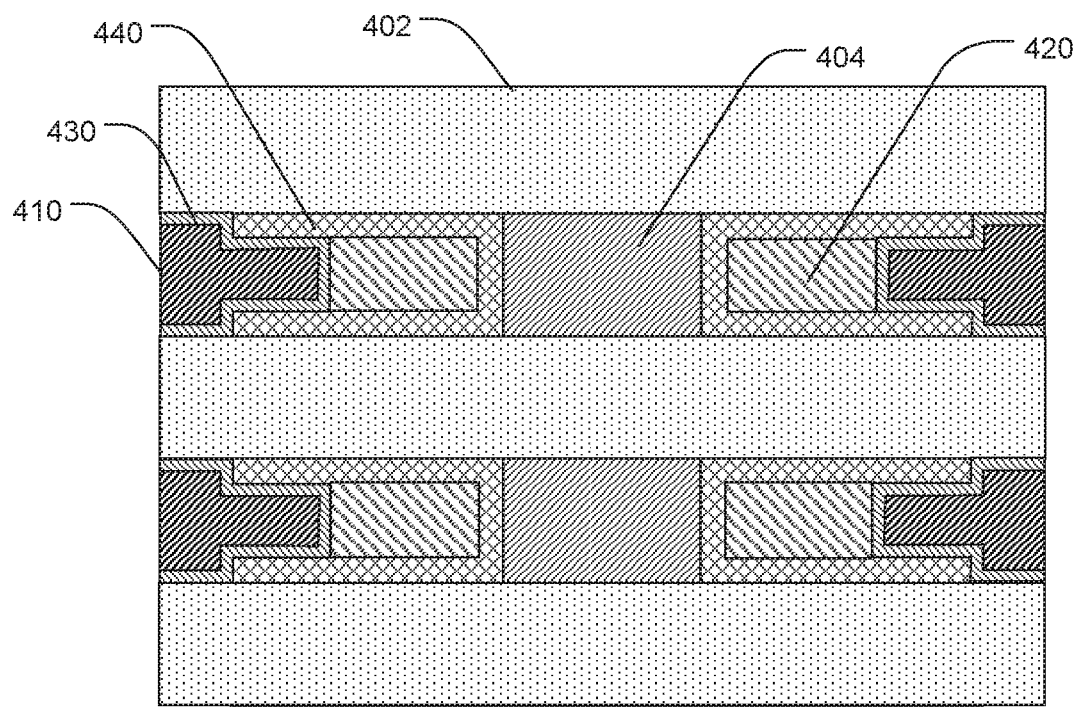

FIG. 4I illustrates individual cell recesses 464 having a dielectric barrier layer 430 conformally deposited therein on the dielectric barrier material 440 and conductive material 420. The dielectric barrier layer 430 can be deposited or formed using any suitable manufacturing technique. Non-limiting examples, can include CVD, ALD, or the like. A chalcogenide material 410 can also be deposited or formed in individual cell recesses 464 on the dielectric barrier layer 430. The chalcogenide material can also be formed or deposited using any suitable manufacturing technique. Non-limiting examples can include CVD, PVD, ALD, or the like. The narrowed portion or region 468 of individual cell recesses 464 can form or shape a narrowed segment and narrowed end of the chalcogenide material 410 proximate to the conductive material 420.

Figure 4J:
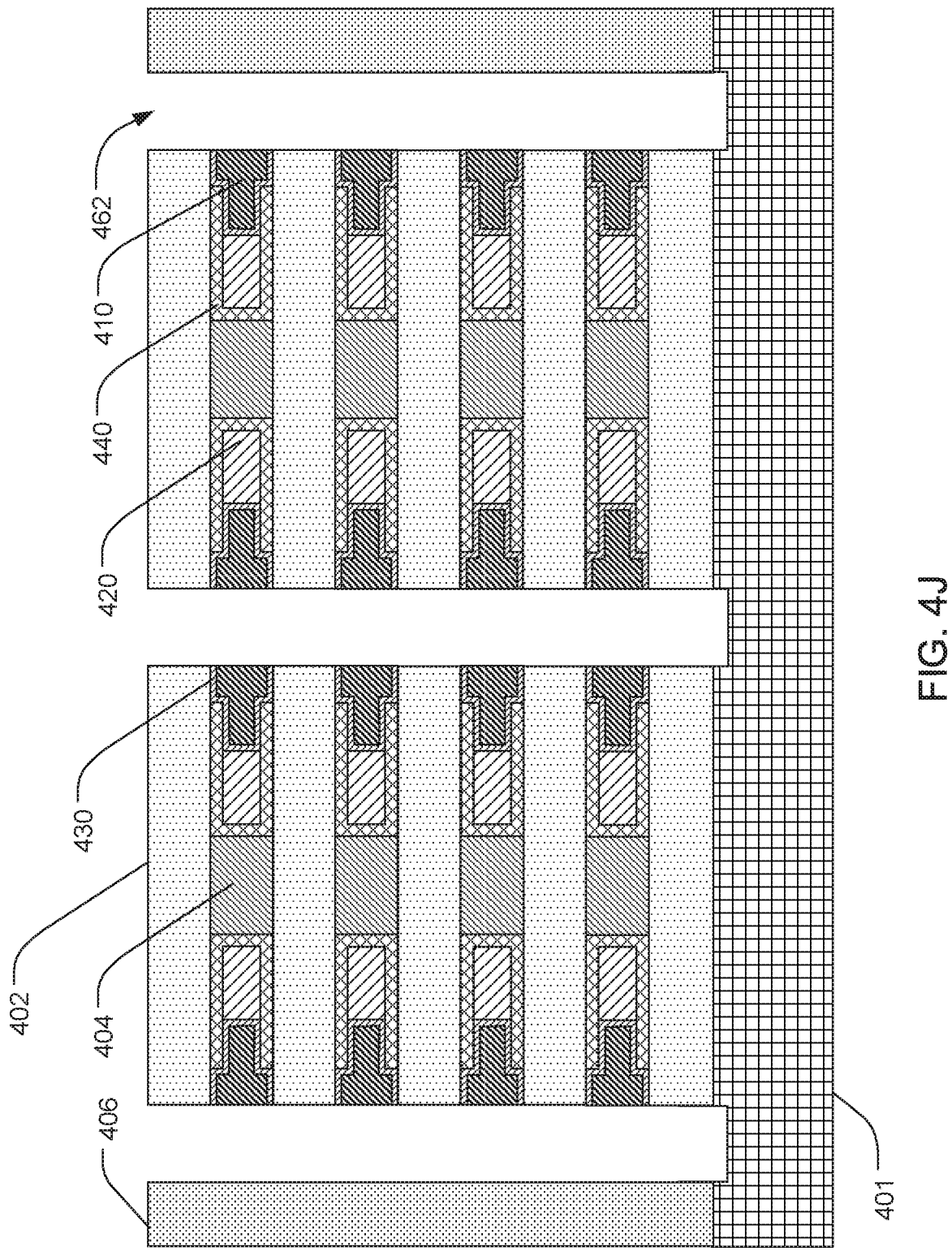
Figure 4K:
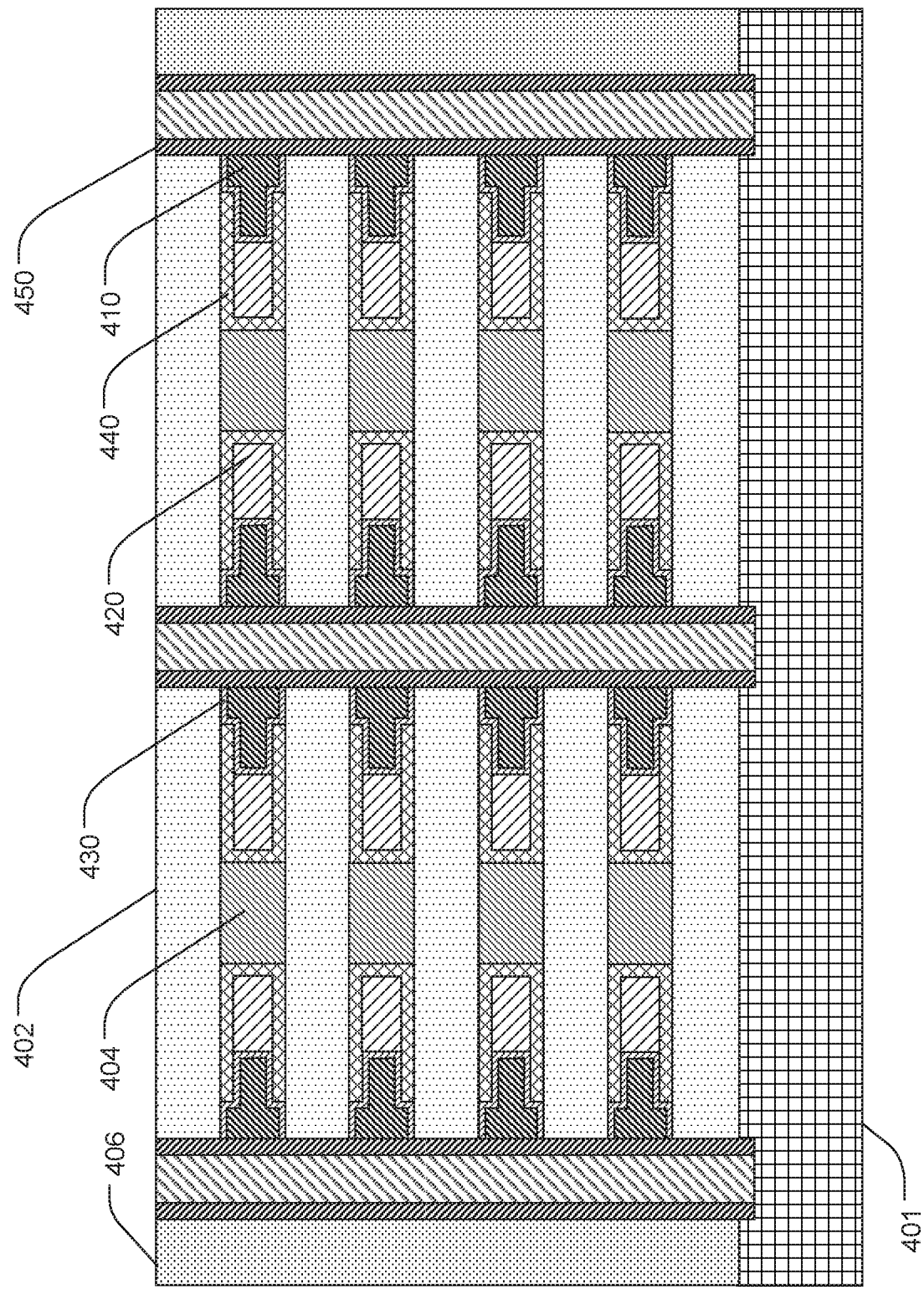

FIG. 4J returns to a broader view of the memory device illustrating individual memory cells formed along individual trenches of the layered stack. FIG. 4K illustrates individual electrode layers 450 formed or deposited within individual trenches 462. Conductive columns 460 are also formed within individual trenches 462 with the electrode layer 450 being positioned between the conductive column and individual memory cells. The electrode layer 450 can be formed or deposited using any suitable manufacturing technique. Non-limiting examples can include CVD, PVD, ALD, or the like. Similarly, the conductive column 460 can be formed or deposited using any suitable manufacturing technique. Non-limiting examples can include CVD, PVD, ALD, or the like.

Examples

In one example there is provided, a memory cell comprising, a chalcogenide material having a narrowed end, a conductive material positioned at the narrowed end, a dielectric barrier layer disposed between the conductive material and the narrowed end, and a dielectric spacer material positioned along a narrowed segment of the chalcogenide material.

In one example of a memory cell, the chalcogenide material comprises a chalcogenide glass.

In one example of a memory cell, the chalcogenide material comprises germanium, antimony, tellurium, silicon, nickel, gallium, arsenic, silver, tin, gold, lead, bismuth, indium, selenium, oxygen, sulphur, nitrogen, carbon, or a combination thereof.

In one example of a memory cell, the chalcogenide material has a programming window between a reset state and a set state of at least 500 millivolts (mV).

In one example of a memory cell, the narrowed end has a thickness that is from about 50% to about 90% of a thickness of an opposite end.

In one example of a memory cell, the conductive material comprises tungsten (W), aluminum (Al), aluminum copper alloy (AlCu), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), yttrium, scandium, or a combination thereof.

In one example of a memory cell, the dielectric barrier layer comprises alumina, hafnium oxide, zirconium oxide, silicon nitride, silicon oxide, silicon oxynitride, or a combination thereof.

In one example of a memory cell, the dielectric barrier layer has a thickness of from 0.5 nm to 2 nm.

In one example of a memory cell, the dielectric spacer material comprises alumina, hafnium oxide, zirconium oxide, silicon nitride, silicon oxide, silicon oxynitride, or a combination thereof.

In one example of a memory cell, the dielectric spacer material has a thickness of from about 1 nm to about 20 nm.

In one example of a memory cell, the dielectric spacer extends along the chalcogenide material from the narrowed end to a distance of from about 10% to about 90% of a length of the chalcogenide material.

In one example of a memory cell, the memory cell is part of a memory structure comprising a plurality of memory cells.

In one example there is provided, a three-dimensional memory device, comprising, an array of conductive columns, an array of conductive rows, and an array of memory cells interconnecting the array of conductive columns and the array of conductive rows, the array of memory cells being individually addressable and individually comprising, a chalcogenide material having a narrowed end, wherein a conductive row is positioned at the narrowed end and a conductive column is positioned at an opposite end thereof, a dielectric barrier layer disposed between the conductive row and the narrowed end, and a dielectric spacer material positioned along a narrowed segment of the chalcogenide material.

In one example of a memory device, the array of conductive rows is formed of a first conductive material.

In one example of a memory device, the first conductive material comprises tungsten (W), tungsten nitride (WN), aluminum (Al), aluminum copper alloy (AlCu), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), ruthenium nitride (RuN), carbon (C), tungsten carbide (WC), or a combination thereof.

In one example of a memory device, the array of conductive columns is formed of a second conductive material.

In one example of a memory device, the second conductive material comprises tungsten (W), tungsten nitride (WN), aluminum (Al), aluminum copper alloy (AlCu), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), ruthenium nitride (RuN), carbon (C), tungsten carbide (WC), or a combination thereof.

In one example of a memory device, the array of conductive columns and the array of conductive rows are formed of the same conductive material.

In one example of a memory device, the array of conductive columns and the array of conductive rows are formed of different conductive materials.

In one example of a memory device, the array of conductive columns and the array of conductive rows are oriented in a substantially perpendicular orientation.

In one example of a memory device, the memory device further includes an electrode layer deposited along individual conductive columns and being positioned between individual conductive columns and the chalcogenide material of individual memory cells.

In one example of a memory device, the electrode layer comprises carbon, carbon nitride, doped polysilicon, a metal, a conductive metal nitride, a conductive metal silicide, a conductive metal oxide, or a combination thereof.

In one example of a memory device, the electrode layer has an electrical resistivity of from about 100 µOhm-cm to about 10 mOhm-cm.

In one example of a memory device, the chalcogenide material comprises chalcogenide material selected from the group consisting of germanium, antimony, tellurium, silicon, nickel, gallium, arsenic, silver, tin, gold, lead, bismuth, indium, selenium, oxygen, sulphur, nitrogen, carbon, yttrium, scandium, and combinations thereof.

In one example of a memory device, the chalcogenide material has a programming window between a reset state and a set state of at least 500 mV.

In one example of a memory device, the narrowed end has a thickness that is from about 50% to about 90% of a thickness of an opposite end.

In one example of a memory device, the dielectric barrier layer comprises alumina, hafnium oxide, zirconium oxide, silicon nitride, silicon oxide, silicon oxynitride, or a combination thereof.

In one example of a memory device, the dielectric barrier layer has a thickness of from 0.5 nm to 2 nm.

In one example of a memory device, the dielectric spacer material comprises alumina, hafnium oxide, zirconium oxide, silicon nitride, silicon oxide, silicon oxynitride, or a combination thereof.

In one example of a memory device, the dielectric spacer material has a thickness of from about 1 nm to about 20 nm.

In one example of a memory device, the dielectric spacer extends along the chalcogenide material from the narrowed end to a distance of from about 10% to about 90% of a length of the chalcogenide material.

In one example there is provided, a computing system comprising, a motherboard, and a memory device as described herein operably coupled to the motherboard.

In one example of a computing system, the computing system comprises a desktop computer, a laptop computer, a tablet, a smartphone, a wearable device, a server, or a combination thereof.

In one example of a computing system, the computing system further comprises a processor, a memory device, a heat sink, a radio, a slot, a port, or a combination thereof operably coupled to the motherboard.

In one example there is provided, a method of manufacturing a memory cell comprising, forming a cell recess within a placeholder layer of a layered stack, depositing a dielectric spacer material in the cell recess to form a narrowed portion thereof, depositing a conductive material in the cell recess, depositing a dielectric barrier layer in the cell recess on the conductive material, and depositing a chalcogenide material in the cell recess on the dielectric barrier layer, wherein the narrowed portion of the cell recess shapes the chalcogenide material to have a narrowed end proximate to the conductive material.

In one example of a method of manufacturing a memory cell, the cell recess is formed between two dielectric layers.

In one example of a method of manufacturing a memory cell, the cell recess is formed via wet etching, isotropic reactive ion etching, or a combination thereof.

In one example of a method of manufacturing a memory cell, the dielectric spacer material is deposited conformally in the cell recess via chemical vapor deposition or atomic layer deposition.

In one example of a method of manufacturing a memory cell, the dielectric spacer material has a thickness of from about 1 nm to about 20 nm.

In one example of a method of manufacturing a memory cell, the conductive material is deposited on the dielectric spacer material.

In one example of a method of manufacturing a memory cell, the method further includes depositing a sacrificial etch stop material within a portion of the cell recess.

In one example of a method of manufacturing a memory cell, the method further includes etching the dielectric spacer material back to the sacrificial etch stop material.

In one example of a method of manufacturing a memory cell, the method further includes removing the sacrificial etch stop material from the cell recess, wherein the narrowed portion of the cell recess is formed by a remaining dielectric spacer material.

In one example of a method of manufacturing a memory cell, depositing the dielectric barrier layer is performed via chemical vapor deposition or atomic layer deposition.

In one example of a method of manufacturing a memory cell, the chalcogenide material has a programming window between a reset state and a set state of at least 500 mV.

In one example of a method of manufacturing a memory cell, the narrowed end has a thickness that is from about 10% to about 90% of a thickness of an opposite end.

In one example, there is provided, a method of manufacturing a memory device comprising, forming a layered stack comprising a plurality of alternating placeholder layers and dielectric layers, forming a plurality of trenches within the layered stack, recessing the plurality of placeholder layers along individual trenches to form a plurality of cell recesses, depositing a dielectric spacer material in the plurality of cell recesses to form a narrowed portion in individual cell recesses, depositing a first conductive material in the plurality of cell recesses to form an array of conductive rows, depositing a dielectric barrier layer within the plurality of cell recesses on the first conductive material, depositing a chalcogenide material within the plurality of cell recesses on the dielectric barrier layer, wherein the narrowed portion of individual cell recesses shapes the chalcogenide material to have a narrowed end proximate to the first conductive material, and depositing a second conductive material within the plurality of trenches to form an array of conductive columns, wherein individual conductive rows are positioned at individual narrowed ends of the chalcogenide material and individual conductive columns are positioned at individual opposite ends of the chalcogenide material.

In one example of manufacturing a memory device, the plurality of trenches is formed via dry etching.

In one example of manufacturing a memory device, the plurality of cell recesses is formed via wet etching, isotropic reactive ion etching, or a combination thereof.

In one example of manufacturing a memory device, the dielectric spacer material is deposited conformally in individual cell recesses via chemical vapor deposition or atomic layer deposition.

In one example of manufacturing a memory device, the dielectric spacer material has a thickness of from 1 nm to about 20 nm.

In one example of manufacturing a memory device, the first conductive material is deposited on the dielectric spacer material.

In one example of manufacturing a memory device, the method further includes depositing a sacrificial etch stop material within a portion of individual cell recesses.

In one example of manufacturing a memory device, the method further includes etching the dielectric spacer material back to the sacrificial etch stop material.

In one example of manufacturing a memory device, the method further includes removing the sacrificial etch stop material from individual cell recesses, wherein the narrowed portion of individual cell recesses is formed by a remaining dielectric spacer material therein.

In one example of manufacturing a memory device, depositing the dielectric barrier layer is performed via chemical vapor deposition or atomic layer deposition.

In one example of manufacturing a memory device, the chalcogenide material in individual memory cells has a programming window between a reset state and a set state of at least 500 mV.

In one example of manufacturing a memory device, the narrowed end of the chalcogenide material in individual memory cells has a thickness that is from about 10% to about 90% of a thickness of an opposite end.

In one example of manufacturing a memory device, the method further includes forming an electrode layer along individual trenches between individual conductive pillars and individual memory cells.

In one example of manufacturing a memory device, the electrode layer comprises carbon, carbon nitride, doped polysilicon, a metal, a conductive metal nitride, a conductive metal silicide, or a combination thereof.

In one example of manufacturing a memory device, the electrode layer has a thickness of from about 5 nm to 50 nm.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology.

What is claimed is:

1. A memory cell, comprising:
   a chalcogenide material having a narrowed end;
   a conductive material positioned at the narrowed end;
   a dielectric barrier layer disposed between the conductive material and the narrowed end; and
   a dielectric spacer material positioned along a narrowed segment of the chalcogenide material;
   wherein the chalcogenide material has a programming window between a reset state and a set state of at least 500 millivolts (mV).

2. The memory cell of claim 1, wherein the chalcogenide material comprises a chalcogenide glass.

3. The memory cell of claim 1, wherein the chalcogenide material comprises germanium, antimony, tellurium, silicon, nickel, gallium, arsenic, silver, tin, gold, lead, bismuth, indium, selenium, oxygen, sulphur, nitrogen, carbon, yttrium, scandium, or a combination thereof.

4. The memory cell of claim 1, wherein the narrowed end has a thickness that is from about 50% to about 90% of a thickness of an opposite end.

5. The memory cell of claim 1, wherein the conductive material comprises tungsten (W), aluminum (Al), aluminum copper alloy (AlCu), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), ruthenium, (Ru), ruthenium nitride (RuN), carbon (C), tungsten carbide (WC), or a combination thereof.

6. The memory cell of claim 1, wherein the dielectric barrier layer comprises alumina, hafnium oxide, zirconium oxide, silicon nitride, silicon oxide, silicon oxynitride, or a combination thereof.

7. The memory cell of claim 1, wherein the dielectric barrier layer has a thickness of from 0.5 nm to 2 nm.

8. The memory cell of claim 1, wherein the dielectric spacer material comprises alumina, hafnium oxide, zirconium oxide, silicon nitride, silicon oxide, silicon oxynitride, or a combination thereof.

9. The memory cell of claim 1, wherein the dielectric spacer material has a thickness of from about 1 nm to about 20 nm.

10. The memory cell of claim 1, wherein the dielectric spacer extends along the chalcogenide material from the narrowed end to a distance of from about 10% to about 90% of a length of the chalcogenide material.

11. The memory cell of claim 1, wherein the memory cell is part of a memory structure comprising a plurality of memory cells.

12. A three-dimensional memory device, comprising:
    an array of conductive columns;
    an array of conductive rows; and
    an array of memory cells interconnecting the array of conductive columns and the array of conductive rows, the array of memory cells being individually addressable and individually comprising:
       a chalcogenide material having a narrowed end, wherein a conductive row is positioned at the narrowed end and a conductive column is positioned at an opposite end thereof;
    an electrode layer positioned between individual conductive columns and the chalcogenide material of individual memory cells and having an electrical resistivity of from about 100 µOhm-cm to about 10 mOhm-cm;
    a dielectric barrier layer disposed between the conductive row and the narrowed end; and
    a dielectric spacer material positioned along a narrowed segment of the chalcogenide material.

13. The memory device of claim 12, wherein the array of conductive rows is formed of a first conductive material.

14. The memory device of claim 12, wherein the array of conductive columns is formed of a second conductive material.

15. The memory device of claim 12, wherein the array of conductive columns and the array of conductive rows are formed of the same conductive material.

16. The memory device of claim 12, wherein the array of conductive columns and the array of conductive rows are formed of different conductive materials.

17. The memory device of claim 12, wherein the array of conductive columns and the array of conductive rows are oriented in a substantially perpendicular orientation.

18. The memory device of claim 1, wherein the electrode layer comprises carbon, carbon nitride, doped polysilicon, a metal, a conductive metal oxide, a conductive metal nitride, a conductive metal silicide, or a combination thereof.

* * * * *